(12) United States Patent
Prasad

(10) Patent No.: US 7,583,532 B2
(45) Date of Patent: Sep. 1, 2009

(54) CHARGE-TRAPPING MEMORY DEVICE AND METHODS FOR ITS MANUFACTURING AND OPERATION

(75) Inventor: Tholasampatti Subramanian Sudhindra Prasad, Dresden (DE)

(73) Assignee: Qimonda Flash GmbH, Dresden (DE)

( * ) Notice: Subject to any disclaimer, the term of this patent is extended or adjusted under 35 U.S.C. 154(b) by 22 days.

(21) Appl. No.: 12/035,837

(22) Filed: Feb. 22, 2008

(65) Prior Publication Data

US 2008/0279004 A1 Nov. 13, 2008

Related U.S. Application Data

(62) Division of application No. 11/444,289, filed on May 31, 2006, now Pat. No. 7,349,254.

(51) Int. Cl.
*G11C 16/06* (2006.01)
(52) U.S. Cl. .................. 365/185.09; 365/185.29; 365/200
(58) Field of Classification Search ............ 365/185.09, 365/185.03, 185.05, 185.29, 185.18, 200
See application file for complete search history.

(56) References Cited

U.S. PATENT DOCUMENTS

| 5,535,369 | A | 7/1996 | Wells et al. |
| 5,715,193 | A | 2/1998 | Norman |
| 6,011,725 | A | 1/2000 | Eitan |
| 6,160,739 | A | 12/2000 | Wong |
| 6,414,876 | B1 * | 7/2002 | Harari et al. ........... 365/185.22 |
| 6,535,428 | B2 | 3/2003 | Pasotti et al. |
| 6,567,304 | B1 * | 5/2003 | Kleveland .............. 365/185.03 |
| 6,587,381 | B2 | 7/2003 | Kanai et al. |
| 7,258,416 | B2 | 8/2007 | Berry et al. |
| 2003/0163633 | A1 | 8/2003 | Aasheim et al. |
| 2003/0227804 | A1 | 12/2003 | Lofgren et al. |
| 2004/0083335 | A1 | 4/2004 | Gonzalez et al. |
| 2004/0257888 | A1 | 12/2004 | Noguchi et al. |
| 2005/0114589 | A1 | 5/2005 | Lofgren et al. |
| 2007/0058440 | A1 | 3/2007 | Lu et al. |
| 2007/0067598 | A1 * | 3/2007 | Fujimoto .................... 711/170 |
| 2008/0219053 | A1 * | 9/2008 | Kim ...................... 365/185.11 |

* cited by examiner

*Primary Examiner*—Tuan T Nguyen
*Assistant Examiner*—Hien N Nguyen
(74) *Attorney, Agent, or Firm*—Slater & Matsil, L.L.P.

(57) ABSTRACT

A method for leveling bit errors in a charge-trapping memory device is included. The memory device has a first and a second sector of memory cells. The first sector is validated by counting a number of bit failures occurring in memory cells of the first sector, the bit failures caused by accessing memory cells of the second sector. Data stored in the first sector is backed up if the validating indicates a likelihood of a forthcoming failure in the first sector.

10 Claims, 8 Drawing Sheets

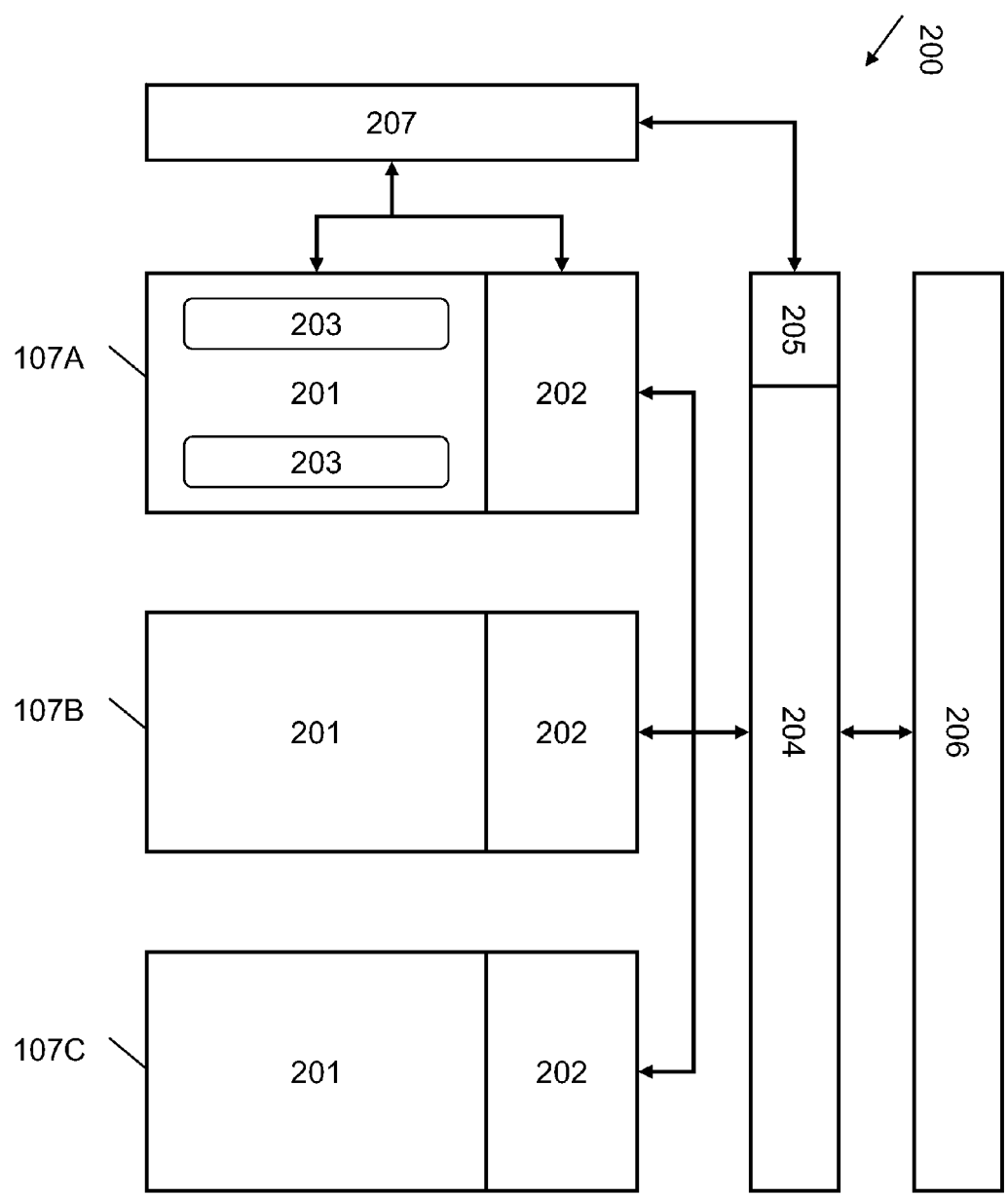

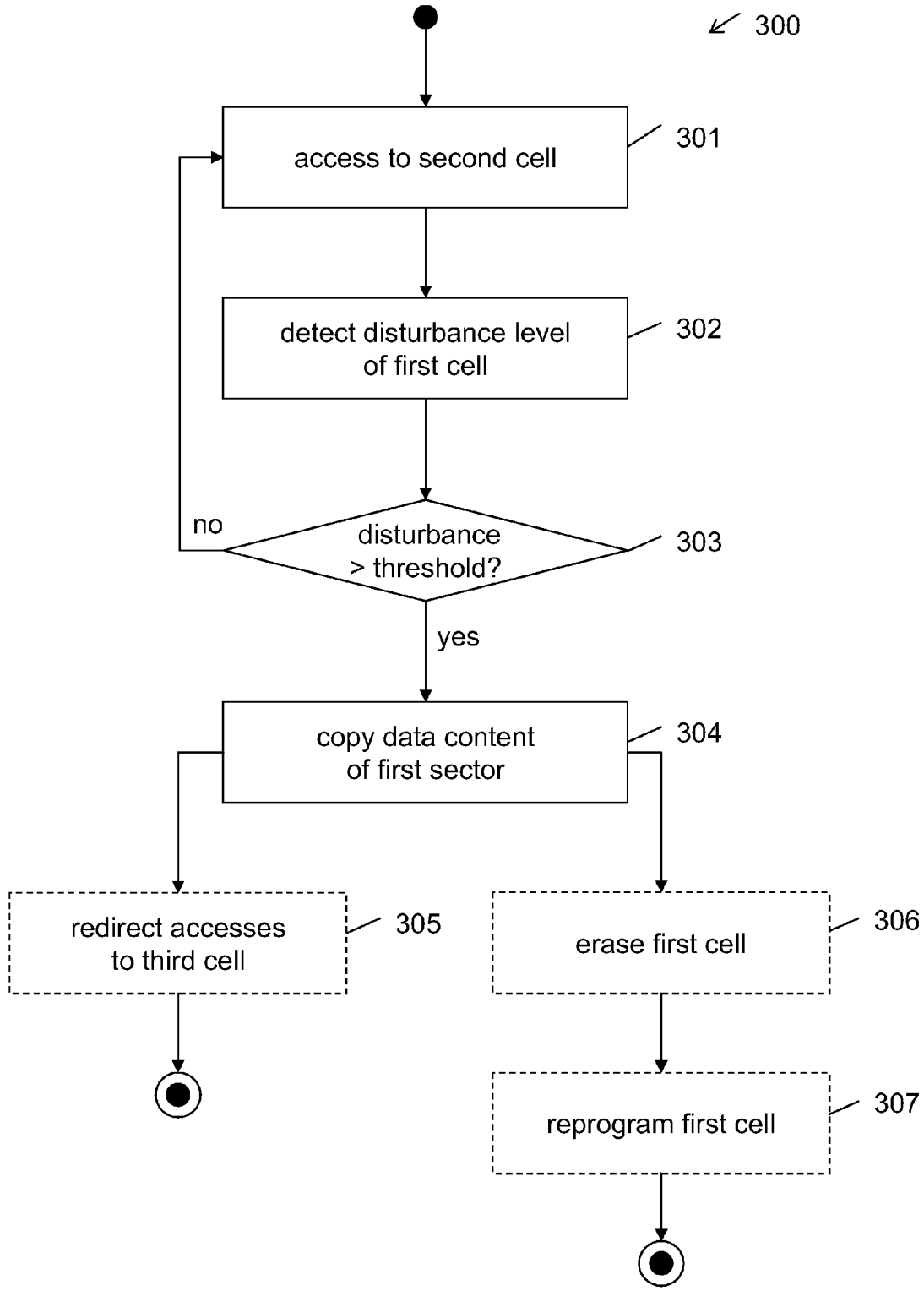

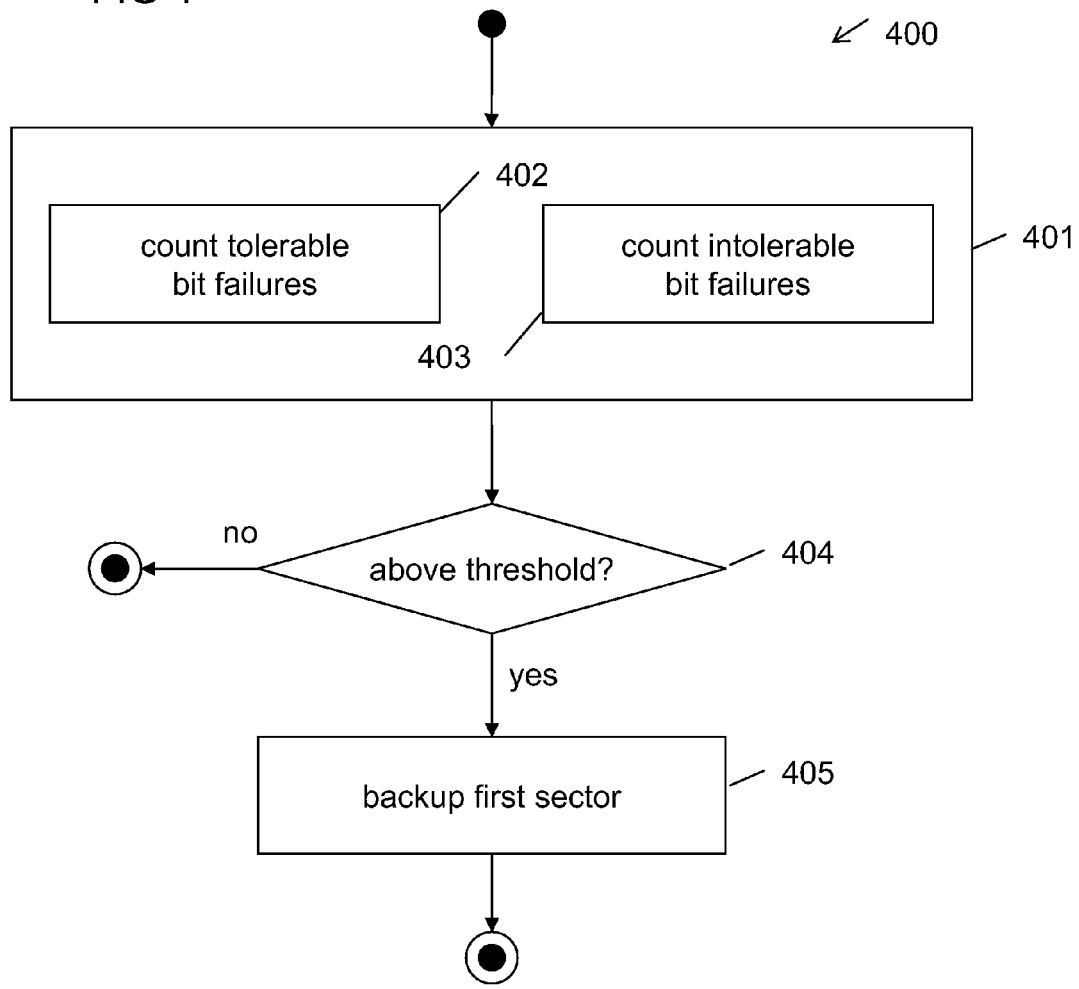

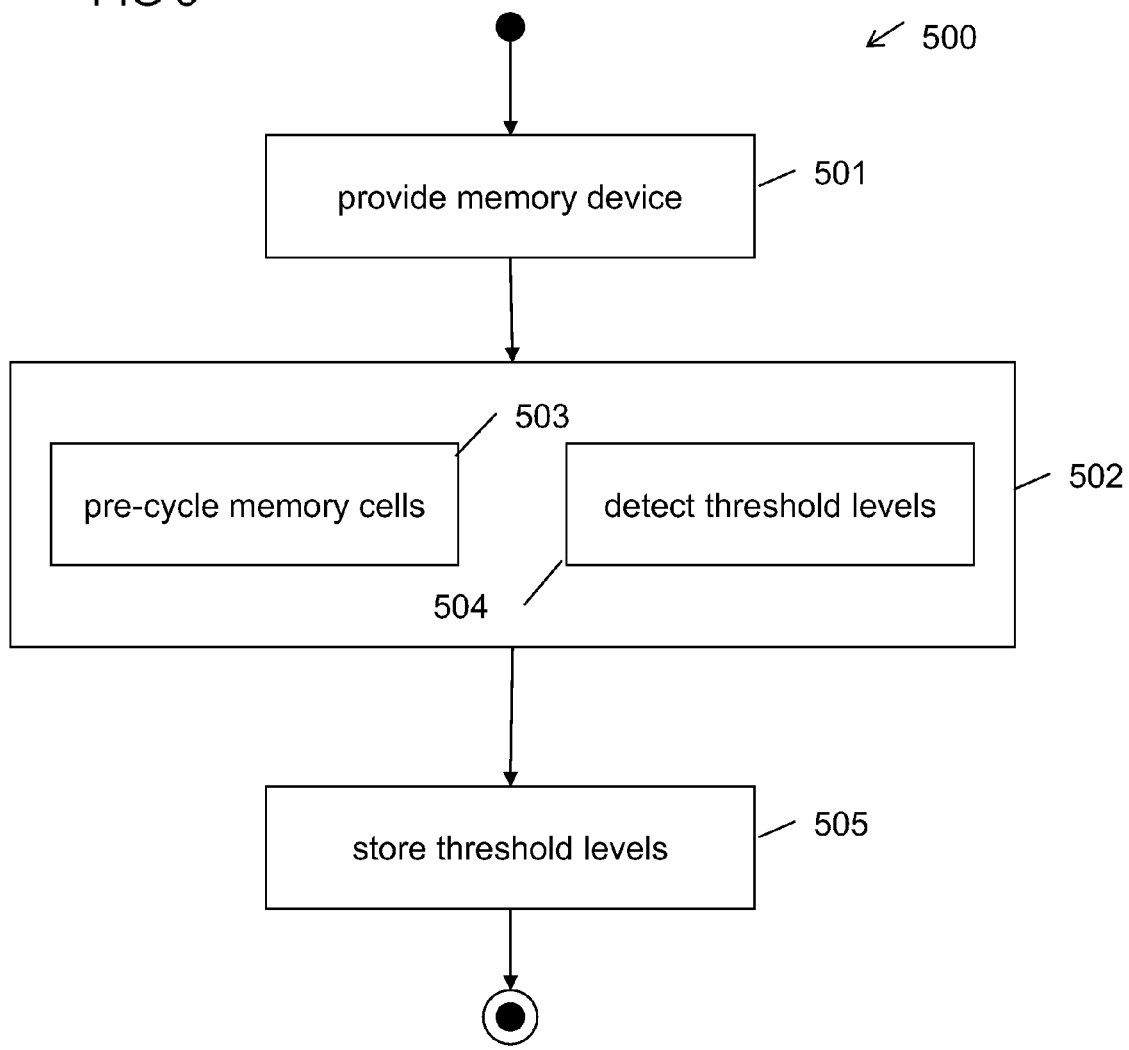

FIG 6A

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6B

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6C

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6D

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6E

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6F

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6G

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

FIG 6H

| Esec 0 | Esec 8 | Esec 16 | Esec 24 | Esec 32 | Esec 40 | Esec 48 | Esec 56 |
|---|---|---|---|---|---|---|---|
| Esec 1 | Esec 9 | Esec 17 | Esec 25 | Esec 33 | Esec 41 | Esec 49 | Esec 57 |
| Esec 2 | Esec 10 | Esec 18 | Esec 26 | Esec 34 | Esec 42 | Esec 50 | Esec 58 |
| Esec 3 | Esec 11 | Esec 19 | Esec 27 | Esec 35 | Esec 43 | Esec 51 | Esec 59 |
| Esec 4 | Esec 12 | Esec 20 | Esec 28 | Esec 36 | Esec 44 | Esec 52 | Esec 60 |
| Esec 5 | Esec 13 | Esec 21 | Esec 29 | Esec 37 | Esec 45 | Esec 53 | Esec 61 |
| Esec 6 | Esec 14 | Esec 22 | Esec 30 | Esec 38 | Esec 46 | Esec 54 | Esec 62 |
| Esec 7 | Esec 15 | Esec 23 | Esec 31 | Esec 39 | Esec 47 | Esec 55 | Esec 63 |

CHARGE-TRAPPING MEMORY DEVICE AND METHODS FOR ITS MANUFACTURING AND OPERATION

This is a divisional of U.S. patent application Ser. No. 11/444,289, which was filed on May 31, 2006 now U.S. Pat. No. 7,349,254 and is incorporated herein by reference in its entirety.

TECHNICAL FIELD

The invention relates to a charge-trapping memory device and to a method for operating a charge-trapping memory device, a method for leveling bit failures in a charge-trapping memory device and a method for manufacturing a charge-trapping memory device.

BACKGROUND

Non-volatile memory devices in general and charge-trapping memory devices in particular are widely used in electronic devices as a reliable type of storage. In particular, battery-operated devices make use of different types of non-volatile memory devices for storing information that is preserved even in the absence of an operational voltage.

In charge-trapping memory devices known as NROM, a programming state of a memory cell of the device is stored by means of trapping electrons in a nitride layer placed between a control gate and a source/drain channel of a modified MOSFET. NROM memory devices can be used to store more than one bit per memory cell. For example, a first charge indicative of a first bit can be stored near a source terminal of an NROM cell whereas a second bit can be stored near a drain terminal of the NROM cell. NROM cells are described in more detail in U.S. Pat. No. 6,011,725 by Eitan, which is incorporated herein by reference.

Unlike other types of non-volatile memory devices, which are typically worn out after a certain number of subsequent programming and erase cycles, NROM memory devices can be cycled almost infinitely and thus have a very long expected lifetime.

However, especially for long-term storage or frequent use, data stored in an NROM memory device may become invalid. This is mainly due to the fact that operations accessing one charge-trapping memory cell can affect other memory cells not accessed. For example, charging a bitline connected to a first memory cell in a first sector and a second memory cell in a second sector will affect the threshold level indicative of a programming state of both cells even though just one cell is actually accessed, for example for erasing, programming or reading.

Non-volatile memory devices often comprise a data area and a redundancy area. Data stored in the redundancy area may be used to validate data stored in the data area. Thus, not every bit error in a non-volatile memory device leads to invalid data or results in an application error. In particular, error correction codes (ECC) may be stored in the redundancy area that allow to detect and correct up to a certain amount of bit failures in a segment of the array. The number of correctable bit failures depends on the concrete organization of the array, in particular the number of segments contained in an erase sector of an array.

For example, an array and an associated control circuit may be adapted to correct single and double bit failures in a segment. However, segments with more than two faulty bits cannot be corrected and consequently pose a risk for application and data consistency.

SUMMARY OF THE INVENTION

According to an embodiment of the invention, a charge-trapping memory device comprises an array of non-volatile memory cells, the array comprising at least a first sector and a second sector, each sector comprising a multiplicity of memory cells, each memory cell adapted to trap an amount of charge indicative of a programming state. The memory device further comprises a control circuit operationally connected to the array and adapted to access a memory cell of the array by means of storing charge in or removing charge from the memory cell, a disturb detection circuit operationally connected to the array or the control circuit and adapted to detect a disturbance level of the first sector based on a disturbance caused by accessing at least one memory cell of the second sector, a disturb leveling circuit operationally connected to the array and the disturbance detection circuit and adapted to back up the programming state of memory cells of the first sector if the detected disturbance level exceeds a predefined threshold.

BRIEF DESCRIPTION OF THE DRAWINGS

The present invention will be described in the following in more detail using a number of presently preferred but nevertheless exemplary embodiments. The embodiments are described with reference to the following figures:

FIG. 2 shows a schematic diagram of a charge-trapping memory device in accordance with a second embodiment of the present invention;

FIG. 3 shows a flowchart for a method for operating a charge-trapping memory device in accordance with an embodiment of the present invention;

FIG. 4 shows a flowchart for a method for leveling bit errors in a charge-trapping memory device in accordance with an embodiment of the present invention;

FIG. 5 shows a flowchart for a method for manufacturing a charge-trapping memory device in accordance with an embodiment of the present invention;

FIGS. 6A to 6H show steps of an exemplary qualification run for a charge trapping memory device in accordance with an embodiment of the present invention;

Figure 1:
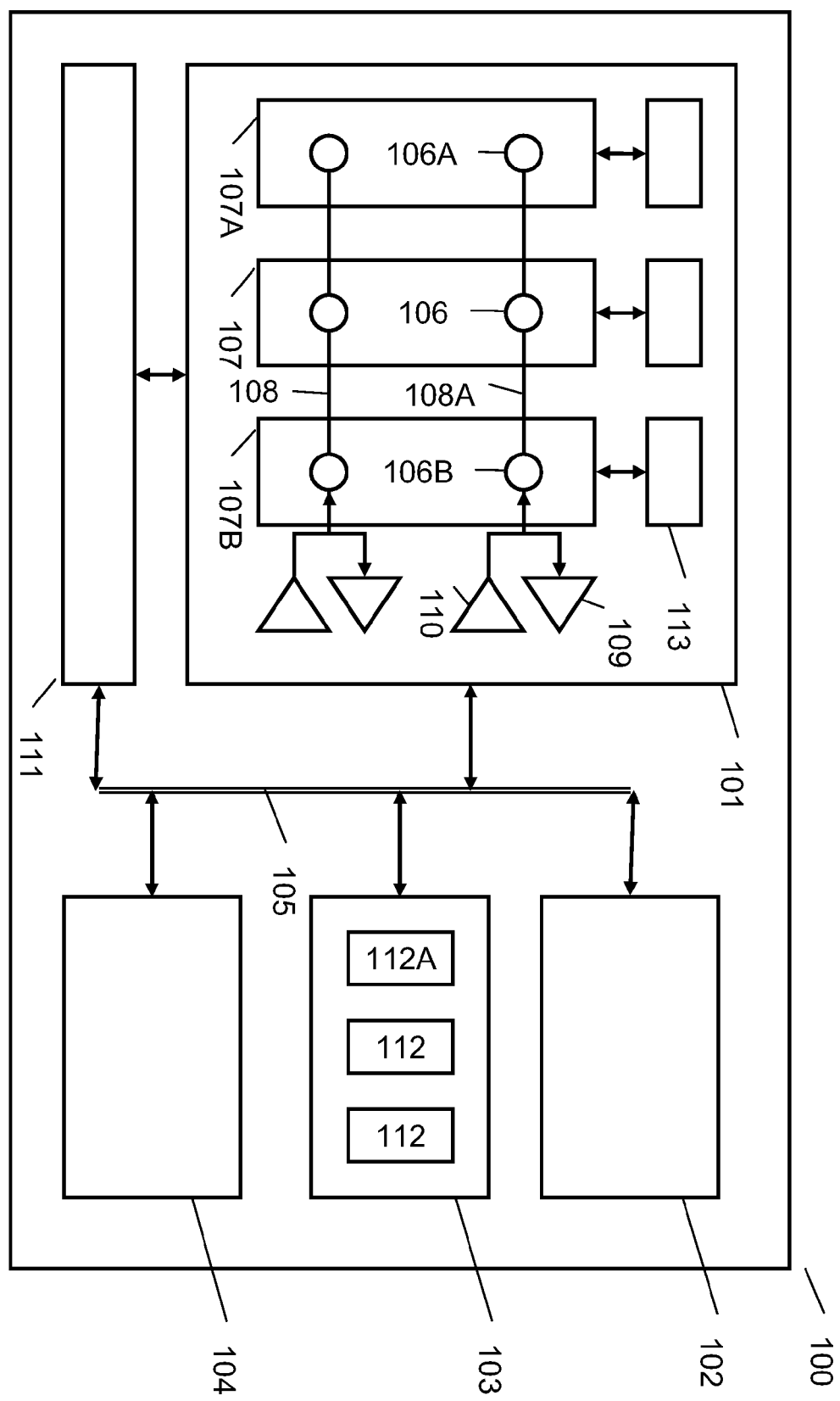
FIG. 1 shows a schematic diagram of a charge-trapping memory device in accordance with a first embodiment of the present invention.

The following list of reference symbols can be used in conjunction with the figures:

| | |
|---|---|
| 100 | charge-trapping memory device |
| 101 | array of memory cells |
| 102 | control circuit |
| 103 | disturb detection circuit |
| 104 | disturb leveling circuit |
| 105 | bus system |
| 106 | non-volatile memory cell |
| 107 | sector |
| 108 | bitline |
| 109 | sense amplifier |
| 110 | write circuit |
| 111 | address decoder |
| 112 | disturb counter |
| 113 | bit failure counter |

-continued

| | |
|---|---|
| 200 | charge-trapping memory device |
| 201 | data area |
| 202 | redundancy area |
| 203 | segment |
| 204 | controller |
| 205 | predefined threshold level |
| 206 | buffer memory |
| 207 | bit failure detector |
| 300 | method for operating a charge-trapping memory device |
| 301-307 | method steps |
| 400 | method for leveling bit failures of a charge-trapping memory device |
| 401-405 | method steps |
| 500 | method for manufacturing a charge-trapping memory device |
| 501-505 | method steps |
| 700 | method 700 for disturb leveling |
| 701-703 | method steps |
| 800 | memory card |
| 801 | interface |
| 802 | interface controller |
| $V_{th}$ | threshold voltage |

DETAILED DESCRIPTION OF ILLUSTRATIVE EMBODIMENTS

By providing a charge-trapping memory device with a disturb detection circuit adapted to detect the disturbance level of a first sector based on a disturbance caused by accessing at least one memory cell of the second sector and also providing a disturb leveling circuit adapted to backup the programming state of memory cells of the first sector if the detector disturbance level exceeds a predefined threshold, programming states of memory cells of the first sector can be safely read out and preserved before non-correctable bit errors occur in the first sector.

According to a further advantageous embodiment, at least one first memory cell of the first sector and at least one second memory cell of the second sector are connected to a common bitline or wordline, the control circuit is adapted to charge the common bitline or wordline in order to access the first cell and charging the common bitline or wordline disturbs the second memory cell. By connecting memory cells of different sectors to a common bitline or wordline, the number of bitlines required for accessing a multiplicity of memory cells of the charge-trapping memory device can be reduced.

According to a further advantageous embodiment, the disturb detection circuit is adapted to detect a number of accesses to the second sector and to perform a predefined action if a predefined number of accesses has been reached. By monitoring the number of accesses to the second sector, predefined action for disturb leveling can be performed.

According to a further advantageous embodiment, the disturb leveling circuit is adapted to backup the programming state of memory cells of the first sector if the number of accesses to the second sector exceeds a predefined number. If the programming state of memory cells is backed up after a predefined number of accesses, failures in the first sector due to disturbance caused by the second sector are prevented.

According to a further advantageous embodiment, the disturb detection circuit is further adapted to detect the number of bit failures in the first sector of memory cells and the disturb leveling circuit is adapted to backup the programming state of memory cells of the first sector if the detected number of bit failures exceeds the predefined threshold. By detecting the number of bit failures in the first sector due to disturbances, the disturb leveling circuit can backup the programming state of memory cells of the first sector in case the first sector reaches a critical number of bit failures.

FIG. 1 shows a charge-trapping memory device 100. The charge-trapping memory device 100 may be an NROM memory device or any other memory device that exhibits a shift in threshold voltage.

The charge-trapping memory device 100 comprises an array 101 of non-volatile memory cells, a control circuit 102, a disturb detection circuit 103 and disturb leveling circuit 104. The array 101, the control circuit 102, the disturb detection circuit 103 and the disturb leveling circuit 104 are connected by a common bus system 105.

The array 101 comprises a multiplicity of non-volatile memory cells 106 arranged in a multiplicity of sectors 107. Three sectors 107, including a first sector 107A and a second sector 107B, are shown in FIG. 1, although there may be many more sectors comprised in an actual charge-trapping memory device 100.

According to FIG. 1, memory cells 106 of the first sector 107A and the second sector 107B are connected by common bitlines 108. The bitlines 108 connect memory cells 106 with a sense amplifier 109 and a write circuit 110. The bitline 108 may be precharged and discharged for reading, erasing and programming operations performed by the sense amplifier 109 or the write circuit 110.

In the example presented in FIG. 1, a first memory cell 106A and a second memory cell 106B are connected to a first bitline 108A in order to limit the number of bitlines 108 required. Individual sectors 107 can be addressed by means of an address decoder 111 for access. However, if the first bitline 108A is precharged to a first voltage level for reading the programming state of the second memory cell 106B by the sense amplifier 109, the first memory cell 106A is also affected, although this cell is not addressed by the address decoder 111. If many such accesses to the second memory cell 106B happen, the programming state of the first memory cell 106A may be affected even though it is not accessed itself.

This is particularly true for so-called NOR-flash memory devices 100, in which every memory cell 106 is directly connected to a bitline 108 and a wordline. However, in memory devices 100 with an array 101 in accordance with the NAND architecture, memory cells 106 may also be affected by accesses to neighboring memory cells 106.

The sense amplifier 109, the write circuit 110 and address decoder 111 are controlled by the control circuit 102. For example, the control circuit 102 may provide an interface to an application or an external device using the data stored in the array 101 or the charge-trapping memory device 100, respectively.

Whenever the control circuit 102 accesses a memory cell 106 of the second sector 107B, the disturb detection circuit 103 increases a disturb counter 112A associated with the first sector 107A. Other disturb counters 112 are provided for counting the disturbances to other sectors 107 of the array 101. Alternatively, the number of accesses to a particular sector 107 or bitline 108 may be counted and used to determine the disturbance on the first sector 107A based on knowledge of the array's design.

In the embodiment presented in FIG. 1, the number of disturbances to the first sector 107A is used to trigger a detection of bit errors in the first sector 107A. For example, if the disturb counter 112A exceeds a predefined threshold, for example 1,000 disturbances to the first sector 107A, the first sector 107A may be validated. Alternatively, the detection of bit failures may be triggered by other events, for example at regular times, on a user or host request.

In the presented embodiment, validating comprises counting the number of bit failures detected within the first sector 107A. Failures can be detected by using error correction codes stored within the memory device 100. Alternatively, threshold voltages $U_{th}$ detected for some or all memory cells 106 of the first sector 107A may be compared with predefined threshold ranges. If a detected threshold voltage $U_{th}$ comes close to the end of the predefined range, the data stored in the corresponding memory cell 106 may become invalid before the next validation takes place.

For the purpose of counting bit failures, a bit failure counter 113 is associated with each sector 107 of the array 101. If the number of bit failures counted exceeds a predefined threshold, the disturbance experienced by the first sector 107 has reached a critical level and the data stored in the first sector 107A must be copied to another storage location in order to prevent forthcoming application errors.

This task is performed by the disturb leveling circuit 104, which may be triggered by a predefined number of counted single bit failures or double bit failures for the exemplary non-volatile memory device with error correction capabilities of up to two bits per segment. The disturb leveling circuit 104 may then copy the data stored in the first sector 107A to a buffer memory, recycle the first sector 107A by erasing the entire sector 107A and writing back the data to the freshly recycled first sector 107A, which then should contain no bit failures.

Alternatively, the data content of the first sector 107A may be copied to an available third sector 107 of the array 101. The copying of the data may be performed by the disturb leveling circuit 104 itself or by means of the control circuit 102.

According to another embodiment of the invention, a charge-trapping memory device is provided, comprising at least two sectors, each sector comprising a data area and a redundancy area, each area comprising a multiplicity of non-volatile memory cells with a charge-trapping layer, a bit failure detector operationally connected to the first sector and adapted to detect the number of bit failures in the data area of the first sector based on data stored in the corresponding redundancy area, the bit failures being caused by accessing memory cells of the second sector, and a controller operationally connected to the first sector and the bit failure detector and adapted to copy data stored in the data area of the first sector to another storage location if the number of bit failures is greater than a predefined threshold.

By providing means for detecting bit failures and copying data from a data area of a first sector if the number of bit failures is greater than a predefined threshold, data can be saved to another storage location in order to protect the data before it is lost irrevocably.

According to a further advantageous embodiment, the controller is further adapted to recycle the memory cells of the first sector after copying the data stored in the first sector to the other storage location. By recycling the memory cells of the first sector, the storage capacity of the charge-trapping memory device can be maintained and its lifespan is extended.

According to a further advantageous embodiment, the controller is adapted to copy back the data to the first sector after copying the data to the other storage location and recycling the memory cells of the first sector. By first copying data of the first sector to another storage location, recycling the memory cells of the first sector and copying back the data to the first sector, memory cells of the first sector are freshly programmed resulting in a reduction of bit errors. In addition, the storage location of the data stored in the first sector remains unchanged.

According to a further advantageous embodiment, the controller is adapted to copy the data to a third sector comprising a multiplicity of memory cells. By copying the data from the first sector to a third sector, only a single copying operation is required improving the performance of the charge-trapping memory device.

FIG. 2 shows a schematic diagram in accordance with a second embodiment of the invention. A charge-trapping memory device 200 comprises a first sector 107A, a second sector 107B and a third sector 107C.

Each sector 107 comprises a data area 201 and a redundancy area 202. The data areas 201 are further subdivided into segments 203, although individual segments 203 are only shown for the first sector 107A for reasons of representational simplicity. A segment 203 may comprise one or several bytes or words of the data area 201. The redundancy area 202 may contain data, such as error correction codes, that, in the presented example, is adapted to detect and correct single and double bit failures of segments 203 of the data area 201.

All three sectors 107 are connected to a controller 204, which is adapted to detect or program a programming state of individual memory cells 106 comprised in one of the sectors 107 and to erase an entire sector 107. The controller 204 is further adapted to determine the number of disturbances experienced by each of the sectors 107 caused by accesses to any other of the sectors 107. For example, the number of disturbances experienced by the first sector 107A may be incremented for each access to the second sector 107B or the third sector 107C.

The number of disturbances is compared with a predefined threshold level 205 stored within the controller 204. The predefined threshold level 205 may be fixed by the design of the charge-trapping memory device 200 or may be set during a qualification process of the charge-trapping device 200. In the latter case the predefined threshold level 205 may be stored in a dedicated area of the charge-trapping memory device 200 and loaded into a register of the controller 204 during initialization of the charge-trapping memory device 200. In this case, predefined threshold values 205 specific to each one of the sectors 107 may be stored.

If a bit failure detector 207 determines that the disturb level of the first sector 107A has reached or exceeds a critical limit, the data stored in the data area 201 of the first sector 107A is copied to another storage location. For example, the controller 204 may buffer the data in a buffer memory 206, which may be an SRAM memory connected to the controller 204. Alternatively, data stored in the data area 201 may be copied to a different sector 107, for example the third sector 107C. The bit failure detector 207 may be part of the controller 204 or operate independently from it.

After the data of the first sector 107A has been copied to another location, the first sector 107A can be recycled by the controller 204. For example the controller 204 may erase the entire first sector 107A. Optionally, after erasing the first sector 107A, the data copied to another location may be copied back to the data area 201 of the first sector 107A. By freshly programming the data area 201, threshold levels indicative of programming states of memory cells 106 of the first sector 107A are brought back to a predefined level, resulting in no or only very few bit errors within the first sector 107A.

Figure 8:
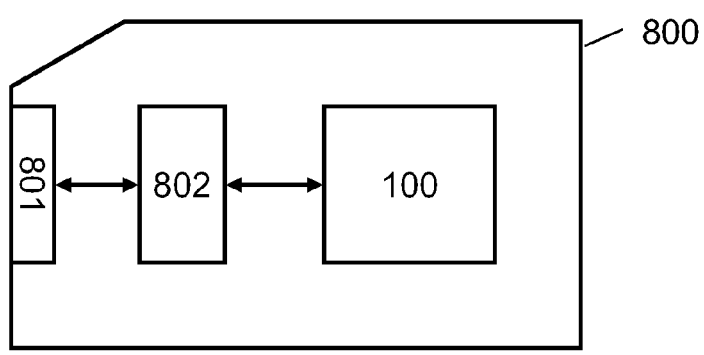
FIG. 8 shows a memory card comprising a charge-trapping memory device in accordance with an embodiment of the present invention.

Charge-trapping memory device 100 or 200 may be integrated into a memory card 800 as shown in FIG. 8. The memory card 800 further comprises an interface 801 and a interface controller 802, allowing a host to access data stored in the charge-trapping memory device 100. The memory card 801 may be a memory card according to the Secure Digital (SD), Mini-SD, Multimedia Card (MMC) or Mini-MMC standard, for example.

According to an embodiment of the invention, a method for operating a charge-trapping memory device is provided. The method comprises the steps of repeatedly charging or discharging a bitline connected to a multiplicity of memory cells in order to perform erase, program or read operations on at least one memory cell connected to the bitline, detecting a disturbance level experienced by a first cell connected to the bitline, and copying the content of the first memory cell if the detected disturbance level exceeds a predefined threshold.

By detecting a disturbance level experienced by a first cell connected to the bitline, accesses to other memory cells connected to the same bitline are considered and the content of the first memory cell can be copied in case the detected disturbance level exceeds a predefined threshold.

According to a further advantageous embodiment, the step of copying comprises copying the content of the first memory cell to the second memory cell and redirecting erase, program and read operations for the first memory cell to the second memory cell. By copying the content of the first memory cell to the second memory cell and redirecting subsequent access operations to the second memory cell, the copying of the data is transparent for applications using the charge-trapping memory device.

According to a further advantageous embodiment, the step of copying comprises copying the content of the first memory cell to a buffer memory, erasing the content of the first memory cell and reprogramming the first memory cell to a programming state corresponding to the buffer's content. By buffering the content of the first memory cell and erasing the first memory cell before writing its original content to the first memory cell, the first memory cell can be recycled for future use. Consequently, the disturb leveling of the first memory cell is transparent to an application using the charge-trapping memory device.

FIG. 3 shows a flowchart of a method 300 for operating a charge-trapping memory device 100 or 200.

In a first step 301a second memory cell 106B is accessed by precharging or discharging a first bitline 108A of the memory device 100 or 200. The precharging or discharging of the bitline 108 is required, for example, in order to detect a programming state of the second memory cell 106B connected to the first bitline 108A.

In a second step 302, a disturbance level of a first memory cell 106A is detected. For example, the number of accesses to the second memory cell 106B comprised in a second sector 107B may be counted and used to determine the disturbance level of the first memory cell 106A comprised in a first sector 107A.

In a subsequent step 303, a check is performed, determining whether the detected disturbance level exceeds a predefined threshold level 205. For example, a movement of a detected threshold voltage $V_{th}$ of a memory cell 106 may be tracked. If the detected disturbance level does not exceed the predefined threshold level 205, the method returns to step 301, where further accesses to the second memory cell 106B of the memory device 100 or 200 may take place.

If, however, the detector disturbance level exceeds the predefined threshold level 205 in step 303, in a further step 304, the content of the first sector 107A is copied. For example, the content of a data area 201 of the first sector 107A may be copied to a redundancy area 202 of a third sector 107C.

According to one embodiment, in step 305, subsequent accesses to memory cells 106 of the first sector 107A are redirected to the third sector 107C. Thus, the copying of the data from the first sector 107A to the third sector 107C in step 304 becomes transparent to an application accessing data stored therein.

In an alternative embodiment, in a step 306, the first sector 107A is erased after copying its content to the third sector 107C. Then, in a step 307, the data area 201 of the first sector 107A is reprogrammed in accordance with the previously backed-up data now stored in the third sector 107C.

After performing disturb leveling in accordance with one of the two alternatives, the method 300 ends or proceeds with step 301.

According to another embodiment of the present invention, a method for leveling bit errors in a charge-trapping memory device with a first and a second sector of memory cells is provided. The method comprises the steps of validating a first sector by counting the number of bit failures occurring in memory cells of the first sector, the bit failures being caused by accessing memory cells of the second sector, and backing up data stored in the first sector if the validating reveals a forthcoming failure in the first sector. By backing up data stored in the first sector in dependence of a validation result of the first sector comprising counting the number of bit failures occurring in it, forthcoming failures of the first sector can be detected and avoided.

According to a further advantageous embodiment, the step of validating the first sector comprises counting the number of tolerable bit failures and counting the number of critical bit failures and the step of backing up data is performed if the number of critical bit failures exceeds a predefined threshold, in particular if any critical bit failure is present. By counting bit failures of different types separately, the step of backing up data can be delayed until a critical level of critical bit failures is reached.

According to a further advantageous embodiment, the first and second sectors are subdivided into segments, a first number of failing bits, in particular a single failing bit, within a segment corresponds to a tolerable bit failure, a second number of failing bits, in particular two failing bits, within a segment corresponds to a critical bit failure, and a third number of failing bits, in particular three or more failing bits, within a segment correspond to an non-correctable bit failure. In the case that three or more failing bits within a segment correspond to an non-correctable bit failure, single failing bits within a segment can be tolerated as a further degradation of the segment can take place without resulting in an application error. Two bit failures within a segment are critical and cannot be tolerated however, as any further increase in the number of failing bits leads to data loss and a potential application error.

FIG. 4 shows a method 400 for leveling bit failures in a charge-trapping memory device 100 or 200.

In a first step 401, a first sector 107A of a charge-trapping memory device 100 or 200 is validated. Step 401 comprises further steps 402 and 403. Steps 402 and 403 may be performed one after another or in parallel.

In step 402, the number of tolerable bit failures is counted by a disturb detection circuit 103 or the bit failure detector 207. For example, the number of single bit failures in a segment 203 of the first sector 107A may be counted.

In step 403, the number of critical bit failures is counted by the disturb detection circuit 103 or the bit failure detector 207. For example, the number of two-bit failures within a segment 203 of the first sector 107A may be counted.

Because any further increase in the number of failing bits within a segment 203 is non-correctable and thus leads to a potential application error, the occurrence of two bit failures are deemed unacceptable in the described embodiment. Because, particularly in NROM memory devices 100 or 200, the occurrence of future bit failures within one segment 203 is predictable based on a previous bit failure history and the number of disturbances experienced by the segment 203, a small number of two-bit failures may be acceptable nonetheless.

In a step 404, the numbers of bit failures counted in steps 402 and 403 are compared with predefined threshold values. The predefined threshold values may be gathered during a qualification of the charge-trapping memory device 100 or 200 or may be set based on device specifications.

If the number of counted bit failures exceeds the predefined threshold values, in a step 405, data stored in the first sector 107A is backed up. The process of backing up data of the first sector 107A has already been described in more detail above.

After backing up data in step 405 or if the number of counted bit failures does not exceed the predefined threshold values in step 404, the method 400 ends.

According to another embodiment of the present invention, a method for manufacturing a charge-trapping memory device is disclosed. According to the method, during qualification a pre-cycling test is performed on a sector of memory cells, during pre-cycling threshold levels characteristic to indicate a forthcoming device failure of the sector are detected, and the detected threshold levels are stored in a non-volatile memory area of a charge-trapping memory device.

By pre-cycling memory cells of the charge-trapping memory device, individual thresholds for each sector of the memory device can be obtained and stored in the non-volatile memory area for future use, in particular for methods and devices in accordance with other aspects of the present invention.

FIG. 5 shows a method 500 for manufacturing a charge-trapping memory device 100 or 200.

In a step 501, a charge-trapping memory device 100 or 200 is provided. For example an NROM memory device 100 or 200 comprising an array 101 of non-volatile memory cells 106 may be provided, which is organized into a multiplicity of sectors 107 for erasing.

In a further step 502, a qualification procedure of the provided memory device 100 or 200 takes place. Qualification may comprise a multiplicity of tests performed on the array 101 and any associated control circuits, prior, during or after the assembly of the memory device 100 or 200. In particular, the qualification comprises steps 503 and 504 described below.

In step 503, memory cells 106 of a sector 107 are pre-cycled. Pre-cycling comprises repeatedly accessing memory cells 106 for programming, erasing or detecting a programming state of memory cells 106. During pre-cycling, expected programming states of a memory cell 106 may be compared with actual programming states detected.

In step 504, threshold levels 205 characteristic for a failure of a memory cell 106 of a sector 107 are detected. For example, if after 5,000 access cycles no critical bit failure was detected but after 6,000 access cycles a critical bit error was detected, the threshold level 205 may be set to 5,000 accesses.

In a step 505, the threshold levels 205 detected in step 504 are stored in a non-volatile memory area of the memory device 100 or 200. For example, threshold levels may be stored at a predefined address of the array 101.

FIGS. 6A to 6H show steps of an exemplary qualification run for a charge-trapping memory device in accordance with an embodiment of the present invention. Each Figure shows a physical sector of an array 101 of memory cells 106, which is subdivided into a multiplicity of erase sectors 107, referred to as "Esec" in the following description of FIGS. 6A to 6H.

Erase sectors 107 are further subdivided into segments 203, though this is not shown for reasons of representational simplicity.

In the example presented, the array 101 may have a total data capacity of 512 MBit and comprise 64 physical sectors with 64 erase sectors 107 each. Thus, each erase sector 107 has a capacity of 0.125 MBit. Of course, other sizes and organizations of the array 101 are possible.

In a first step shown in FIG. 6A, the Esec 9 is selected as target area for the qualification run. Thus, Esec 9 is called "victim" in the following description. The victim is cycled a predefined number of times, e.g., all memory cells 106 comprised in Esec 9 are erased and programmed 10,000 times, such that all memory cells 106 are in a programmed state at the end of the first step. Other patterns, such as a checkerboard pattern, may be used for the pre-cycling.

In a subsequent step shown in FIG. 6B, Esec 8 is selected for cycling. Cycling Esec 8 disturbs the memory cells 106 of the Esec 9, thus Esec 8 is called "aggressor" in the following. The aggressor is cycled a predefined number of times, for example it may be erased and programmed 1,000 times using a predefined bit pattern. Thus, the victim experiences 1,000 disturbances during this step. At the end of this step, the number of bit errors in the victim are counted by verifying detected programming states or threshold voltages $U_{th}$ with respect to the pattern used for pre-cycling.

During subsequent steps shown in FIGS. 6C to 6H, the Esec 10 to 15 are cycled as described above. Thus, at the end of the presented qualification run, the victim has experienced 7,000 disturbances in total. The programming state of the victim has been verified after 1,000 disturbances each.

During this run, the following validation results may have been obtained:
10 k pre-cycling done and victim area programmed:
No failing segments
Victim after 1 k disturb:
2 failing segments (both 1-bit)
Victim after 2 k disturb:
5 failing segments (all 1-bit)
Victim after 3 k disturb:
9 failing segments (all 1-bit)
Victim after 5 k disturb:
13 failing segments
(Eleven 1-Bit Failures and Two 2-Bit Failures)
Victim after 7 k disturb:
16 failing segments
(Twelve 1 bit failures; three 2-bit failures and one segment with more than 2 failing bits that is not repairable)

According to these results, threshold values are set to a maximum of ten 1-bit failures (tolerable failures) and one 2-bit failure (critical failure) for Esec 9 during qualification. Disturb leveling is performed if either the number of tolerable bit errors or the number of critical bit errors for any segment 203 exceeds the predefined threshold value. Consequently, Esec 9 would be disturb-leveled in an application scenario similar to the situation after the 5 k disturb test and thus before a non-repairable segments 203 would occur.

A memory device 100 or 200 may also consider other measures used for disturb leveling individual segments or sectors of a memory device, such as erase counters, for example.

The occurrence of bit failures during bitline disturb follows a typical pattern, where single bit failures occur after some amount of disturb. On further cycling, these will develop into double bit failures. Eventually, segments 203 with double bit failures progress into segments 203 with non-correctable bit failures, i.e., non-repairable pages with three or more failing bits per segment 203.

On areas with good bitline disturb properties, the failure probability is not so high, whereas on the areas with poor bitline disturb properties, the increase in failures is dramatic. Consequently, threshold levels specific to each sector may be obtained and stored during qualification. In addition or alternatively, threshold values may be adapted during the memory devices lifetime. For example, if the number of bit failures increases more or less rapidly than predicted for a specific sector, threshold levels for that sector may be reduced or increased in response.

In some embodiments, the verification of data stored in a sector of memory cells may be performed independently from counting accesses to another sector. For example, each sector 107 of non-volatile memory cells 106 of a charge-trapping memory device 100 or 200 may be validated at regular intervals.

Figure 7:
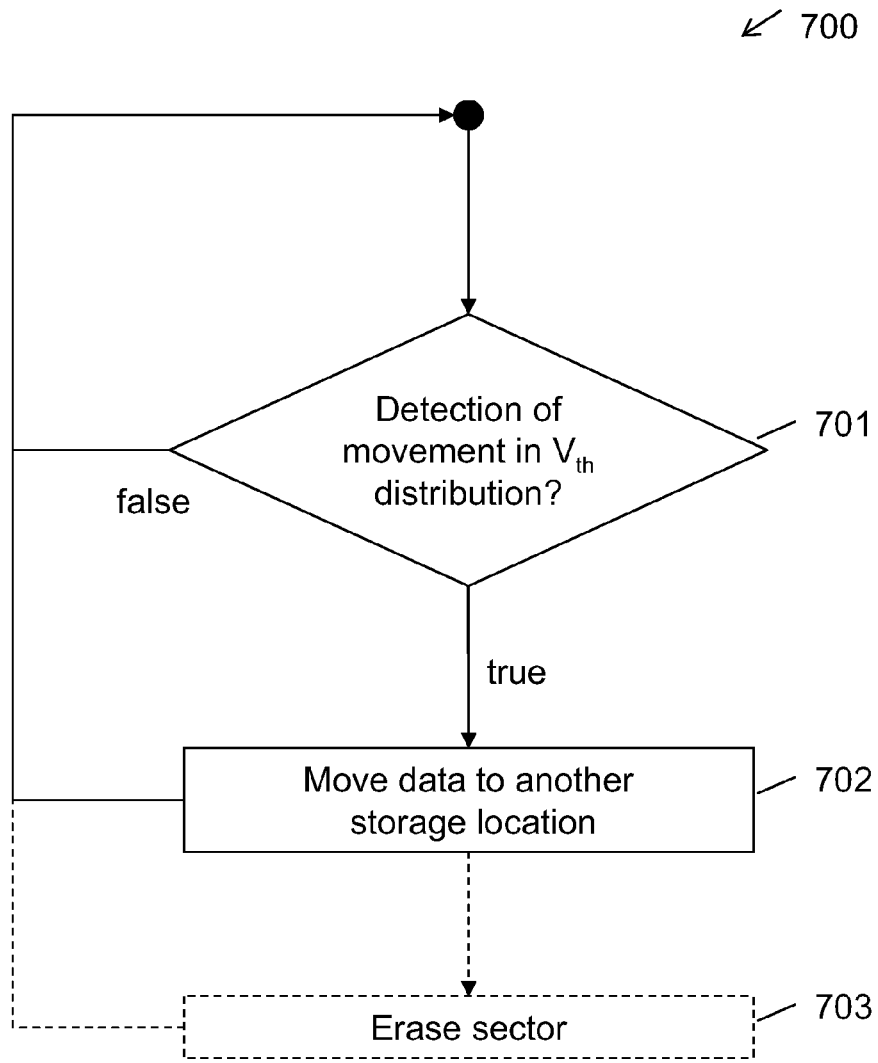
FIG. 7 shows a method for disturb leveling in accordance with an embodiment of the present invention.

FIG. 7 shows a method 700 for disturb leveling independent of counting accesses to sectors 107 of a charge-trapping memory device 100 or 200.

In a step 701, a possible movement of a distribution of threshold voltages $V_{th}$ of memory cells 106 of a sector 107 is detected. For example, the standard deviation of the distribution around a predefined threshold voltage associated with possible programming states may be computed. If the deviation exceeds a predefined threshold or has significantly changed since the last verification, the sector 107 may be on the brink of failure.

In this case, the method continues in step 702 by moving the data stored in the verified sector 107 to another storage location as detailed above. Otherwise, the method starts all over again, possibly waiting for a predefined amount of time before verification starts again in step 701.

In an optional step 703, the sector 107 is erased after the data stored therein has been copied to another storage location. In this way, the sector 107 may be reused, as its disturb levels are reset be erasing.

Although the invention is described with reference to presently preferred embodiments shown in FIGS. 1 to 8 and described above, a person skilled in the art of designing non-volatile memory devices may add, remove or replace individual components or steps described herein without departing from the underlying inventive idea, which shall only be restricted by the claims as detailed below.

In general, the idea underlying the invention is applicable to any other non-volatile memory devices and technology that exhibits a shift in threshold voltage that in turn might initiate error correction.

In particular, though in most current designs accessing a common bitline is the predominant factor for disturbing neighboring cells, an access to a common wordline or control line, or a combination thereof may also cause disturbance and may thus be observed in a similar fashion.

In addition, functional units shown as independent entities may be implemented in a single physical unit in either hardware or software. Inversely, functional units shown as a single entity may be broken up into multiple physical units, for example, for reasons of device performance, simplicity or reliability.

What is claimed is:

1. A method for leveling bit errors in a charge-trapping memory device with a first and a second sector of memory cells, the method comprising:
   validating the first sector by counting a number of bit failures occurring in memory cells of the first sector, the bit failures being caused by accessing memory cells of the second sector; and
   backing up data stored in the first sector if the validating indicates a likelihood of a forthcoming failure in the first sector.

2. The method according to claim 1, wherein:
   validating the first sector comprises counting a number of tolerable bit failures and counting a number of critical bit failures; and
   backing up data is performed if the number of critical bit failures exceeds a predefined threshold.

3. The method according to claim 2, wherein backing up data is performed if any critical bit failure is present.

4. The method according to claim 2, wherein:
   the first and second sectors are subdivided into segments;
   a first number of failing bits within a segment corresponds to a tolerable bit failure;
   a second number of failing bits within a segment corresponds to a critical bit failure; and
   a third number of failing bits within a segment corresponds to a non-correctable bit failure.

5. The method according to claim 4, wherein the first number is one, the second number is two and the third number is three.

6. The method according to claim 1, wherein backing up data comprises:
   copying the data stored in the first sector to the second sector; and
   redirecting erase, program and read operations from the first sector to the second sector.

7. The method according to claim 1, wherein backing up data comprises:
   copying the data stored in the first sector to a buffer memory;
   erasing the content of the first sector; and
   copying back the data stored in the buffer memory to the erased first sector.

8. A memory card device, comprising:
   a charge-trapping memory device comprising:
      at least two sectors, each sector comprising a data area and redundancy area, each area comprising a plurality of non-volatile memory cells, each memory cell including a charge-trapping layer;
      a bit failure detector operationally connected to a first sector and adapted to detect a number of bit failures of the data area of the first sector based on data stored in the corresponding redundancy area, the bit failures being caused by accessing memory cells of a second sector; and
      a controller operationally connected to the first sector and the bit failure detector and adapted to copy data stored in the data area of the first sector to another storage location if the number of bit failures is greater than a predefined threshold;
   an interface for connecting the memory card to a host system; and
   an interface controller connecting the interface with the charge-trapping memory device and providing the host system with access to data stored therein.

9. The memory card device according to claim 8, wherein the controller is adapted to recycle the memory cells of the first sector by erasing or programming the memory cells to a predefined threshold level.

10. The memory card device according to claim 9, wherein the controller is adapted to copy the data to a volatile buffer memory, recycle the memory cells of the first sector and copy back the data from the volatile buffer memory to the first sector.

* * * * *